US011092815B2

(12) United States Patent
Sinkular et al.

(10) Patent No.: US 11,092,815 B2
(45) Date of Patent: Aug. 17, 2021

(54) METASURFACE LENS ASSEMBLY FOR CHROMATIC SEPARATION

(71) Applicants: MAGNA INTERNATIONAL, INC., Aurora (CA); Jasmin Jijina Sinkular, Bloomfield Hills, MI (US); Boris Shulkin, West Bloomfield, MI (US); Benjamin May, Luebs (DE); Joern Ihlenburg, Berlin (DE); Todd Deaville, Markham (CA); Umer Shahid, Rochester, MI (US); Yuesheng Lu, Farmington Hills, MI (US)

(72) Inventors: Jasmin Jijina Sinkular, Bloomfield Hills, MI (US); Boris Shulkin, West Bloomfield, MI (US); Benjamin May, Luebs (DE); Joern Ihlenburg, Berlin (DE); Todd Deaville, Markham (CA); Umer Shahid, Rochester, MI (US); Yuesheng Lu, Farmington Hills, MI (US)

(73) Assignee: MAGNA INTERNATIONAL INC., Aurora (CA)

( * ) Notice: Subject to any disclaimer, the term of this patent is extended or adjusted under 35 U.S.C. 154(b) by 0 days.

(21) Appl. No.: 16/331,540

(22) PCT Filed: Sep. 3, 2017

(86) PCT No.: PCT/US2017/049990
§ 371 (c)(1),
(2) Date: Mar. 8, 2019

(87) PCT Pub. No.: WO2018/052750
PCT Pub. Date: Mar. 22, 2018

(65) Prior Publication Data
US 2019/0204610 A1 Jul. 4, 2019

Related U.S. Application Data

(60) Provisional application No. 62/394,918, filed on Sep. 15, 2016.

(51) Int. Cl.
*G02B 27/10* (2006.01)
*G02B 1/00* (2006.01)
(Continued)

(52) U.S. Cl.
CPC ......... *G02B 27/1013* (2013.01); *G02B 1/002* (2013.01); *G02B 3/0012* (2013.01);
(Continued)

(58) Field of Classification Search
CPC .. G02B 27/1013; G02B 3/0012; G02B 5/201; H01L 27/14645; H01L 27/14625
See application file for complete search history.

(56) References Cited

U.S. PATENT DOCUMENTS 6,958,862 B1   10/2005   Joseph
8,654,328 B2   2/2014    Tkaczyk et al.
(Continued)

FOREIGN PATENT DOCUMENTS

CN   101799589 A   8/2010

OTHER PUBLICATIONS

Supplemental European Search report dated Apr. 21, 2020.
(Continued)

*Primary Examiner* — Anthony Ho
(74) *Attorney, Agent, or Firm* — Dickinson Wright PLLC

(57) ABSTRACT

A metasurface lens assembly to perform chromatic separation includes a first layer with a plurality of nanofins extending transversely there from and each being optically anisotropic and transmissive to light in the visible spectrum and having an optical characteristic that is set according to
(Continued)

a phase profile. A second layer is spaced apart from the first layer and includes a plurality of photosensitive subpixels each associated with a different color. In operation, many beams of light may be directed onto the metasurface lens from a source with each beam of light having a plurality of component colors. The nanofins may function in combination with one another according to the phase profile to bend and focus the beams of light onto the second layer with each of the component colors being bent and focused differently to direct the component colors onto corresponding ones of the photosensitive subpixels.

17 Claims, 5 Drawing Sheets

(51) Int. Cl.
*G02B 5/20* (2006.01)
*G02B 3/00* (2006.01)
*G02B 27/12* (2006.01)
*H01L 27/146* (2006.01)

(52) U.S. Cl.
CPC .......... *G02B 5/201* (2013.01); *G02B 27/123* (2013.01); *H01L 27/14625* (2013.01); *H01L 27/14645* (2013.01); *G02B 2207/101* (2013.01)

(56) References Cited

U.S. PATENT DOCUMENTS

2014/0277433 A1    9/2014   Pugh et al.
2014/0374574 A1    12/2014  Girard Desprolet et al.

OTHER PUBLICATIONS

Scheuer, Jacob; "Metasurfaces-based holography and beam shaping: engineering the phase profile of light", Nanophotonics, Aug. 11, 2016 (Aug. 11, 2016), pp. 137-152, XP055684417, DOI: 10.1515/nanoph-2016-0109 Retrieved from the Internet: URL:https://www.degruyter.com/view/journals/nanoph/6/1/article-p137.xml.

Devlin, et al., Robert C.; "High efficiency dielectric metasurfaces at visible wavelengths", Mar. 8, 2016 (Mar. 8, 2016), XP055630399, DOI: 10.1073/pnas.1611740113; Retrieved from the Internet: URL:https://arxiv.org/ftp/arxiv/papers/1603/1603.02735.pdf.

Khorasaninejad, Mohammadreza et al.; "Planar Lenses at Visible Wavelengths", Arxiv, May 7, 2016 (May 7, 2016), pp. 1-17, XP055430437, Retrieved from the Internet: URL:https://arxiv.org/ftp/arxiv/papers/1605/1605.02248.pdf.

METASURFACE LENS ASSEMBLY FOR CHROMATIC SEPARATION

CROSS REFERENCE TO RELATED APPLICATIONS

This U.S. National Stage Patent Application claims the benefit of PCT International Patent Application Serial No. PCT/US2017/049990 filed Sep. 3, 2017 entitled "Metasurface Lens Assembly For Chromatic Separation" which claims the benefit of and priority to U.S. Provisional Patent Application Ser. No. 62/394,918 filed Sep. 15, 2016 entitled "Metasurface Lens Assembly For Chromatic Separation," the entire disclosures of the applications being considered part of the disclosure of this application and hereby incorporated by reference.

BACKGROUND OF THE INVENTION

1. Field of the Invention

A metasurface lens assembly to perform chromatic separation and to direct light upon different areas of an image sensor based on the component color of the separated light.

2. Discussion

Lenses are used in various applications including directing and focusing light onto photosensitive subpixels that comprise image sensors. Chromatic separation, or the process of separating light into its component colors has a number of practical applications. One important application is in color image sensors, which use an array of photosensitive subpixels corresponding to different color. Traditional color image sensors employ color filters over each subpixel to allow only the light having the designated color onto the photosensitive subpixels. Advancements have been made in imaging sensors providing greater resolutions using increasing numbers of photosensitive subpixels in smaller sensors. These advancements have involved both shrinking the size of the subpixels and placing them in closer proximity to one another. One problem that arises from subpixels being placed in close proximity is crosstalk, or the tendency for light intended for one photosensitive subpixel to activate a different, adjacent photosensitive subpixel. A traditional solution to the problem of crosstalk is to provide a microlens above each photosensitive subpixel to direct light onto that specific photosensitive subpixel and away from other ones. Imagers, or arrays of photosensitive subpixels are commonly used in the prior art in combination with a lens assembly which must be aligned with the imager through a series of steps aimed at optimizing the sharpness/clarity of an image rendered via a Modulation Transfer Function (MTF) in the center field of view and four corners of the image. Traditionally, the lens assembly is glued to the imager when the peaks of the MTF curves line up as close together for all five parts of the image.

Advancements have been made recently in the field of metasurface lenses, or lenses that use a plurality of nanofins to direct and focus light similar to the way traditional refractive lenses function. One feature of metasurface lenses is that they may have optical characteristics which are dependent on the color or wavelength of the light passing therethrough. See, for example, Devlin, Robert C., et al. "High efficiency dielectric metasurfaces at visible wavelengths." arXiv preprint arXiv:1603.02735 (Mar. 8, 2016). See also Khorasaninejad, Mohammadreza, et al. "Planar Lenses at Visible Wavelengths." arXiv preprint arXiv:1605.02248 (May 7, 2016). See also Yu, Nanfang, and Federico Capasso. "Optical metasurfaces and prospect of their applications including fiber optics." Journal of Lightwave Technology 33.12 (Jun. 15, 2015): 2344-2358.

A metasurface lens assembly according to the present invention uses such a feature of optical characteristics that vary according to the color of the light passing therethrough to perform chromatic separation and to direct component colors of a beam of light directly onto corresponding photosensitive subpixels without the need for microlenses or color filters.

A metasurface lens assembly according to the present invention provides for a lens which can be integrally formed with the second layer of photosensitive subpixels and which does not require costly fabrication steps such as the alignment process used with lens assemblies of the prior art. The present invention may further provide the additional benefit of increased sensitivity over image sensors of the prior art which filter-out a significant portion of a beam of light in order to provide each photosensitive subpixel with only one component color.

SUMMARY OF THE INVENTION

The invention provides for a metasurface lens assembly to perform chromatic separation. The metasurface lens may include a first layer with a plurality of nanofins extending transversely therefrom and each being optically anisotropic and transmissive to light in the visible spectrum. The nanofins may function in combination together with an optical characteristic that is set according to a phase profile. The optical characteristic may be an orientation of each of the nanofins. For example, the phase profile may be imparted by the rotation of each nanofin about a lateral axis perpendicular to the first layer.

A second layer may be spaced apart from the first layer and may include a plurality of photosensitive subpixels each associated with a different color of a color set such as the primary colors of red, green, and blue. The photosensitive subpixels may be arranged systematically, such as in a Bayer pattern.

In operation, many beams of light may be directed onto the metasurface lens from a source with each beam of light having a plurality of component colors each having a different wavelength which may pass generally transversely through the first layer. The nanofins may bend and focus the beams of light onto the second layer. This bending and focusing of the beams of light may be performed by the combined operation of the nanofins together according to the phase profile. Specifically, the nanofins may bend and focus each of the component colors differently and may be configured according to the phase profile to direct the component colors onto corresponding ones of the photosensitive subpixels.

The invention in its broadest aspect provides for a color image sensor assembly which does not require microlenses and/or color filters as are generally used in color image sensors of the prior art to separate and direct different color light onto photosensitive subpixels associated with each color. The invention may also prevent light of one color being inadvertently directed onto a photosensitive subpixel that is associated with and intended for the detection of light of a different color, the phenomenon known as crosstalk. By providing for a color image sensor without microlenses and/or color filters, a color image sensor may be made which is more precise and is easier to produce because the traditional steps involved manufacturing and aligning the microlenses and color filters may be eliminated.

The invention may provide for a lens which can be integrally formed with the second layer of photosensitive subpixels and which does not require costly fabrication steps such as connecting the layers together in precise alignment. Specifically, the lens may include the first layer with the plurality of nanofins disposed on a shared substrate or on separate substrates bonded to one another, such as in a sandwich arrangement.

The invention may further provide the additional benefit of increased sensitivity over image sensors of the prior art which filter-out a significant portion of a beam of light in order to provide each photosensitive subpixel with only one component color. In contrast, the device of the present invention directs substantially all of the beam of light onto one or more photosensitive subpixels associated with the corresponding component colors of the beam of light.

BRIEF DESCRIPTION OF THE DRAWINGS

Other advantages of the present invention will be readily appreciated, as the same becomes better understood by reference to the following detailed description when considered in connection with the accompanying drawings wherein.

DESCRIPTION OF THE ENABLING EMBODIMENT

Figure 1:
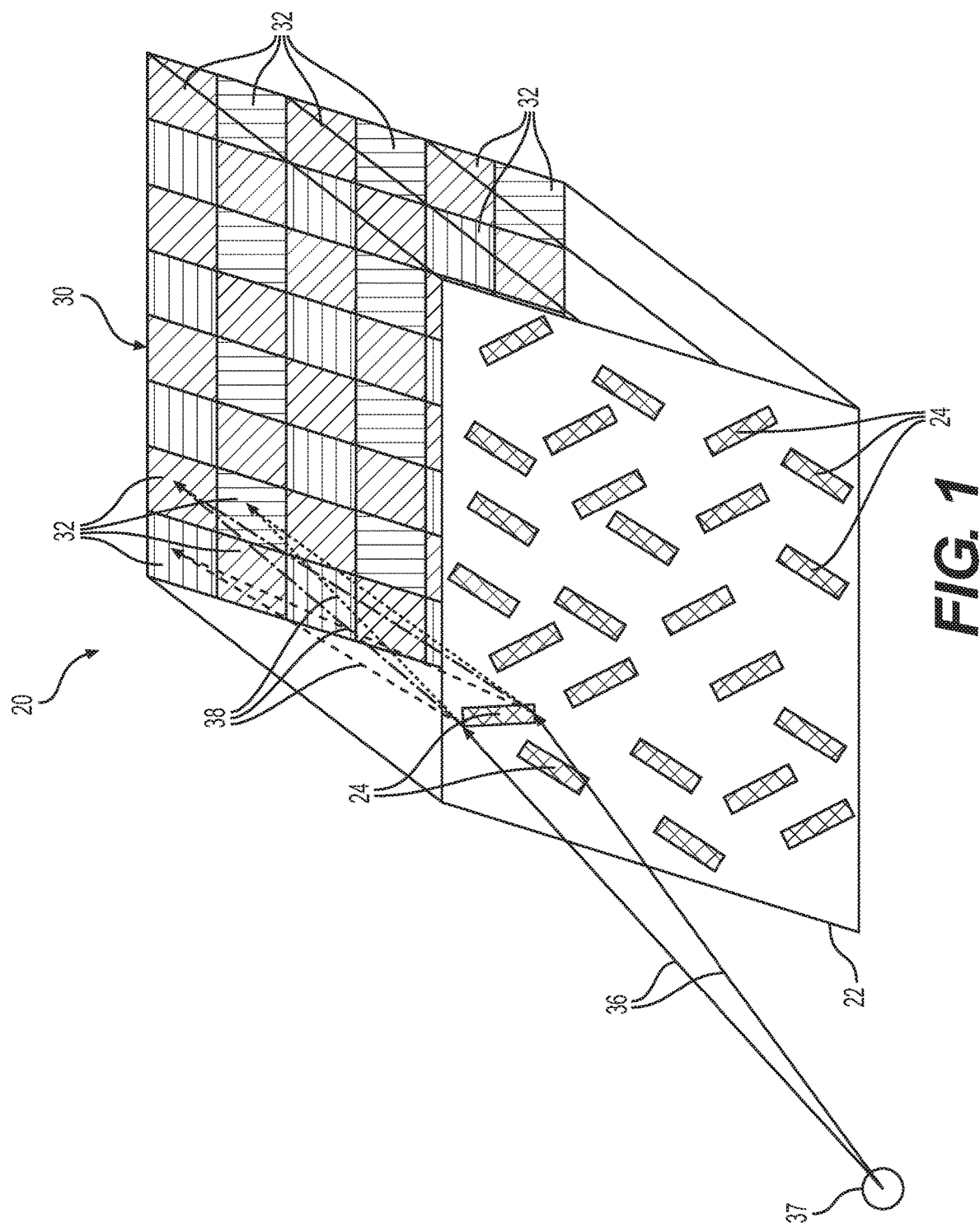
FIG. 1 is a perspective view of a graphic representation of a metasurface lens.
Figure 3:
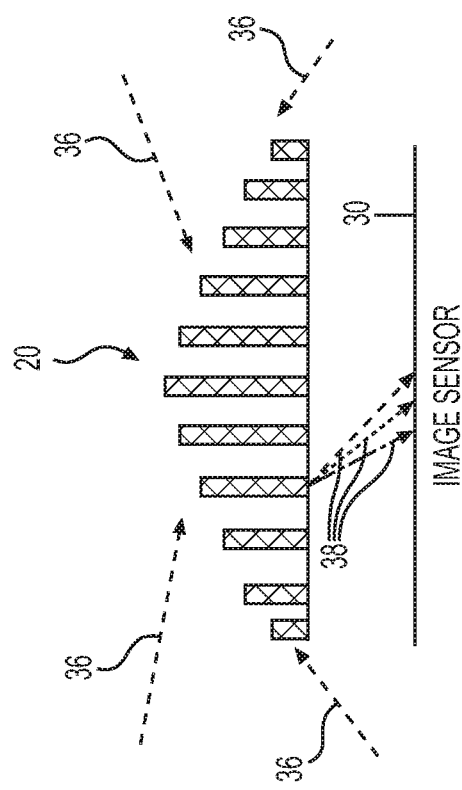
FIG. 3 is a cross-section of a graphic representation of a metasurface lens having a planar first layer with a plurality of nanofins having different heights.
Figure 2:
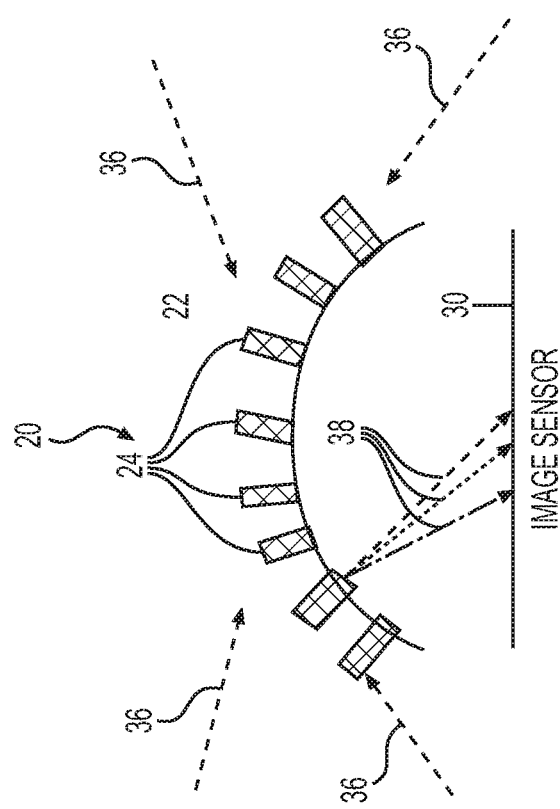
FIG. 2 is a cross-section of a graphic representation of a metasurface lens having a curved first layer.
Figure 4:
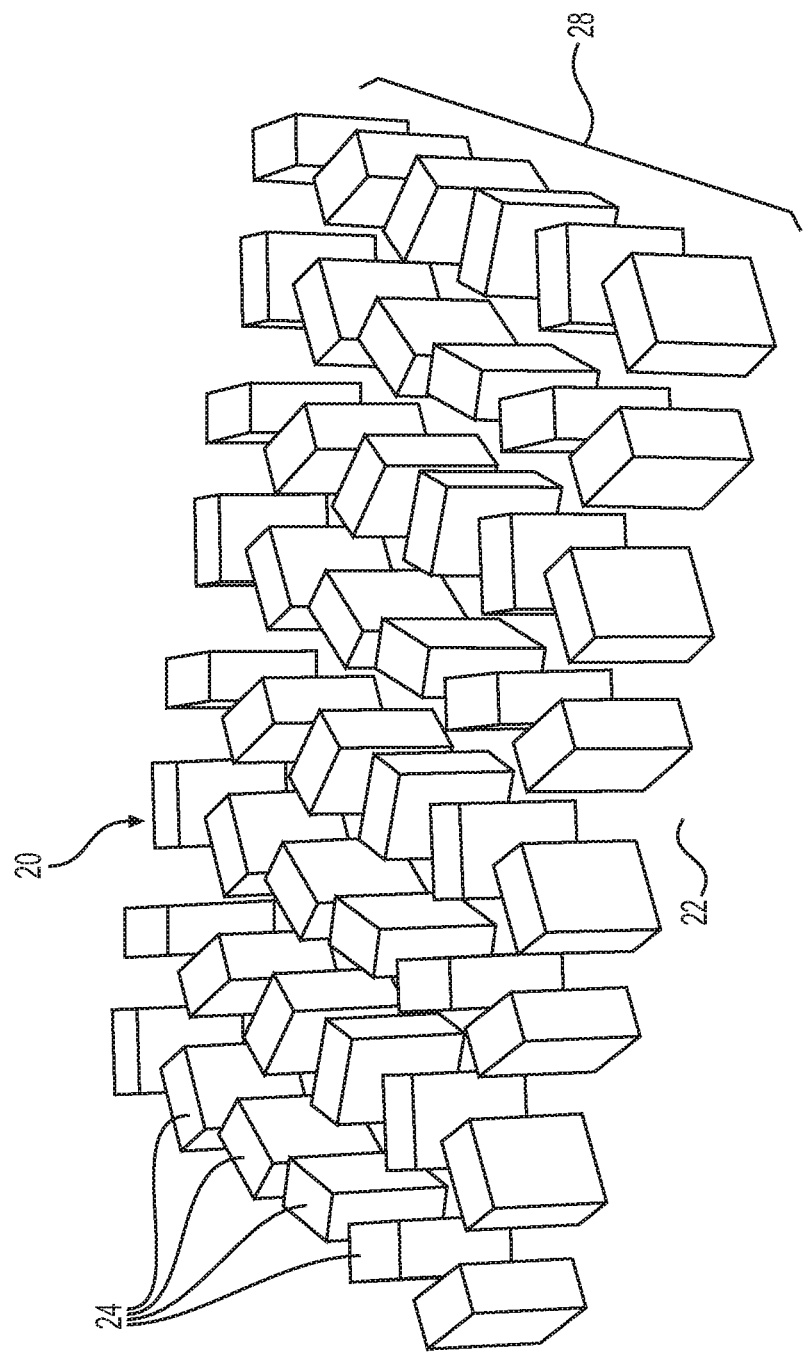
FIG. 4 is perspective view of a first layer with a plurality of nanofins oriented according to a phase profile in accordance with an aspect of the invention.
Figure 5:
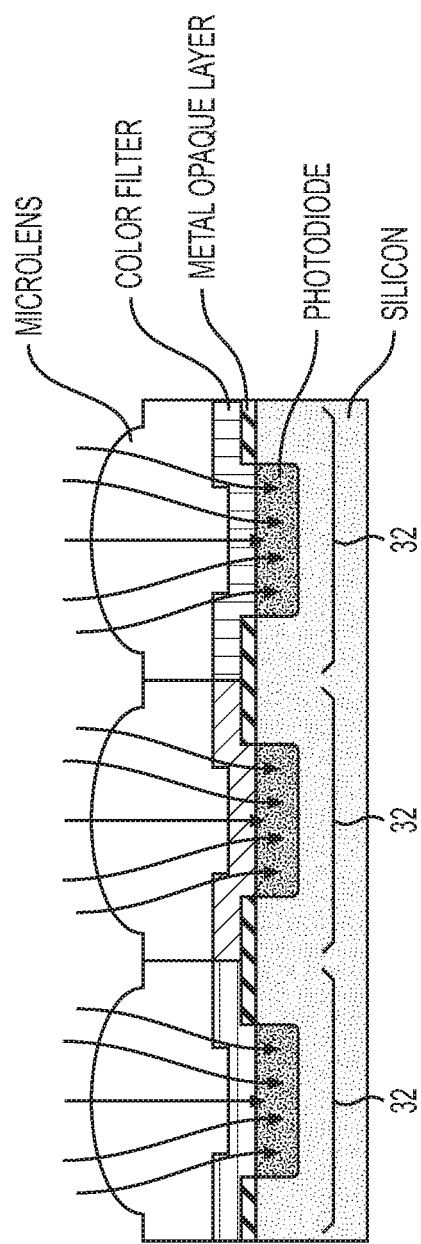
FIG. 5 is a cross-sectional graphic representation of a segment of an image sensor of the prior art, including a microlens and color filter on each photosensitive subpixel.

Referring to the Figures, wherein like numerals indicate corresponding parts throughout the several views, a metasurface lens 20 assembly to perform chromatic separation is provided and may include a first layer 22 with a plurality of nanofins 24 extending transversely therefrom and each being optically anisotropic and transmissive to light in the visible spectrum. The nanofins 24 may exhibit shape birefringence which is the optical property of a material having a refractive index that depends on the polarization and propagation direction of light as well as the shape or orientation of the material with respect to the light. The first layer together with the nanofins 24 may be called a metasurface. The nanofins 24 may function in combination together with an optical characteristic 26 that is set according to a phase profile 28, which may be, for example, a pattern of distributing the nanofins 24 having different positions, orientations, or other property or combination of properties. In other words, each of the nanofins 24 may be configured according to the phase profile 28 to function in combination much as a traditional lens bends and focuses light passing therethrough.

The nanofins 24 may be made of amorphous titanium dioxide ($TiO_2$) with a tetrakis (dimethylamido) titanium (TDMAT) precursor and may be shaped as rectangles which may function as waveguides for the light passing therethrough. According to one aspect, the optical characteristic 26 may be an orientation of each of the nanofins 24. For example, the phase profile 28 may be imparted by the rotation of each nanofin 24 about a lateral axis, with each lateral axis being perpendicular to the first layer 22. According to an alternative aspect, the optical characteristic 26 may be a height of each of the nanofins 24 in a direction transverse to the first layer 22. According to a further alternative aspect, the optical characteristic 26 may be an index of refraction which varies for different ones of the nanofins 24.

A second layer 30 may be spaced apart from the first layer 22 and may include a plurality of photosensitive subpixels 32 each associated with a different color of a color set 34. The photosensitive subpixels 32 may be, for example, photodiodes and may act in combination as an image sensor. The color set 34 may include the primary colors of red, green, and blue. The color set 34 may also include other, different, colors such as red, green, blue, and emerald; cyan, magenta, and yellow; cyan, magenta, yellow, and green; or cyan, magenta, yellow, and white. The photosensitive subpixels 32 may be arranged systematically, such as, for example in a Bayer pattern or any other regular or irregular arrangement.

In operation, many beams of light 36 may be directed onto the metasurface lens 20 from a source 37 with each beam of light 36 having a plurality of component colors 38 each having a different wavelength which may pass generally transversely through the first layer 22. The nanofins 24 may bend and focus the beam of light 36 onto the second layer 30. This bending and focusing of the beam of light 36 may be performed by the combined operation of the nanofins 24 together according to the phase profile 28.

The nanofins 24 on the first layer 22 may bend and focus each of the component colors 38 differently and may thereby direct the component colors 38 onto corresponding ones of the photosensitive subpixels 32.

According to one aspect, each of the photosensitive subpixels 32 may have a focal length as its distance from the first layer 22 and ones of the photosensitive subpixels 32 being associated with each of the colors of the color set 34 may have a different focal length than other ones of the photosensitive subpixels 32 associated with a different one of the colors of the color set 34. For example, the red subpixels may be disposed at a first focal length, the green subpixels may be disposed at a second focal length different than the first focal length, and the blue subpixels may be disposed at a third focal length different than the first and second focal lengths.

According to another aspect, the first layer 22 and the second layer 30 may be formed on a shared substrate. Alternatively, the layers 22, 30 may be formed on two or more independent substrates bonded to one another, such as in a sandwich arrangement. The layers 22, 30 may be formed upon one another using, for example, one or more subtractive, additive, or semi-additive process or processes.

The first layer 22 may be generally planar and disposed parallel to the second layer 30. Alternatively, the first layer 22 may be curved to provide an angle of view greater than 180 degrees and/or to reduce chromatic aberration.

Figure 7:
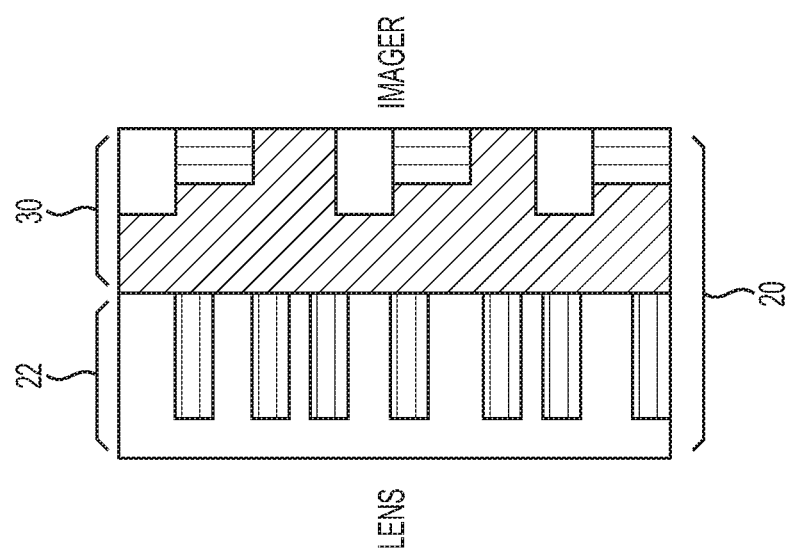
FIG. 7 is a simplified cross-section of a metasurface lens and imager.
Figure 6:
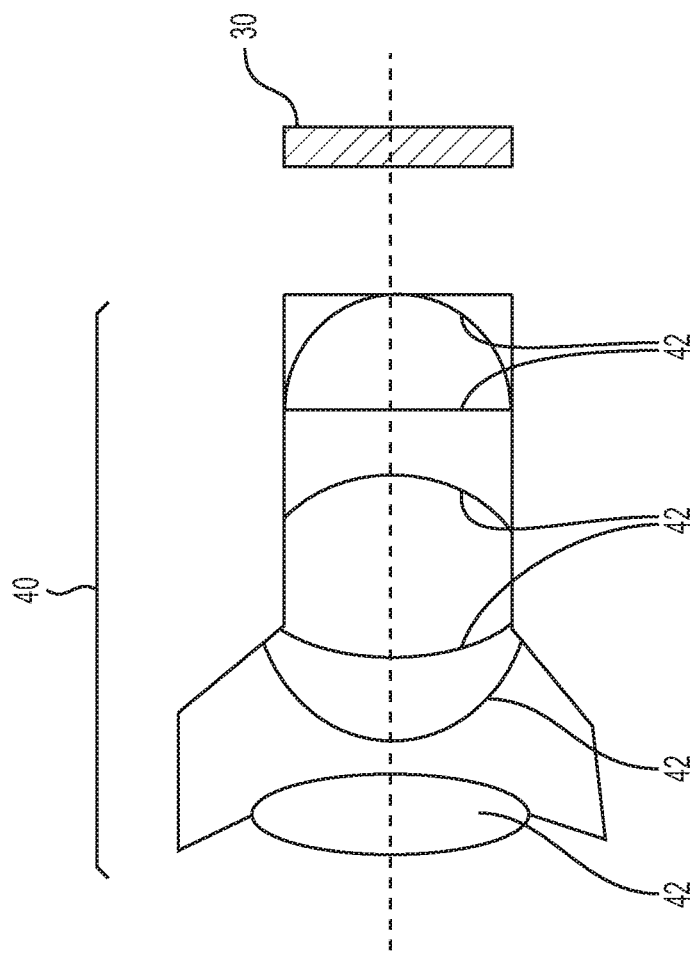
FIG. 6 is a simplified cross-section of an image sensor and lens of the prior art.

As shown in FIG. 6, a lens assembly 40 is generally provided in prior art imaging systems to direct and focus light on to the second layer 30, which is also known as an imager. As shown, lens assemblies 40 can include several component lenses 42 and may require complex operations to construct and to align with one another and with the second layer 30. FIG. 7 shows a simplified cross-sectional view of a metasurface lens 20 assembly, including the first layer 22, which may take the place of the lens assembly 40 of the prior art.

Obviously, many modifications and variations of the present invention are possible in light of the above teachings and may be practiced otherwise than as specifically described while within the scope of the appended claims. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A metasurface lens assembly to perform chromatic separation comprising:
   a first layer with a plurality of nanofins each extending transversely therefrom to a distal end, and each being optically anisotropic and transmissive to light in the visible spectrum with shape birefringence and each having an optical characteristic set according to a phase profile, wherein said optical characteristic is one of a height between the first layer and the distal end or an orientation about a corresponding lateral axis extending perpendicular to the first layer;
   a second layer spaced apart from said first layer and including a plurality of photosensitive subpixels each associated with a different color of a color set;
   a beam of light passing generally transversely through said first layer with said nanofins acting together according to said phase profile to bend and focus said beam of light onto said second layer;
   said beam of light having a plurality of component colors each having a different wavelength; and
   said nanofins on said first layer configured to bend and focus each of said component colors differently and to direct said component colors onto corresponding ones of said photosensitive subpixels.

2. The metasurface lens assembly as set forth in claim 1 wherein said plurality of photosensitive subpixels of said first layer are arranged in a Bayer pattern.

3. The metasurface lens assembly as set forth in claim 1 wherein each of said photosensitive subpixels has a focal length as the distance from said first layer, and wherein each of said photosensitive subpixels associated with a given one of the colors of the color set has the same focal length, and wherein said photosensitive subpixels associated with different colors have different focal lengths.

4. The metasurface lens assembly as set forth in claim 1 wherein said first layer and said second layer are formed on a shared substrate.

5. The metasurface lens assembly as set forth in claim 1 wherein said first layer is generally planar and is disposed parallel to said second layer.

6. The metasurface lens assembly as set forth in claim 1 wherein said first layer is curved to provide an angle of view greater than 180 degrees.

7. The metasurface lens assembly as set forth in claim 1 wherein said optical characteristic is the height between the first layer and the distal end.

8. The metasurface lens assembly as set forth in claim 1 wherein said color set includes the primary colors of red, green, and blue.

9. The metasurface lens assembly as set forth in claim 1, wherein each of said nanofins within said plurality of nanofins has a same size and shape as each of the other ones of said nanofins within said plurality of nanofins.

10. The metasurface lens assembly as set forth in claim 1 wherein said optical characteristic is the orientation about the corresponding lateral axis extending perpendicular to said first layer.

11. The metasurface lens assembly as set forth in claim 1, wherein each of said nanofins within said plurality of nanofins has a generally rectangular cross-section adjacent said first layer.

12. The metasurface lens assembly as set forth in claim 1, wherein each of said nanofins within said plurality of nanofins has a constant cross-section along said height.

13. A metasurface lens assembly comprising:
   a first layer with a plurality of nanofins each extending transversely therefrom and each being optically anisotropic and transmissive to light in the visible spectrum and in combination together having an optical characteristic set according to a phase profile;
   a second layer including a plurality of photosensitive subpixels each associated with a different color of a color set;
   said nanofins on said first layer configured to bend and focus each of a plurality of component colors within a beam of light and to direct said component colors onto corresponding ones of said photosensitive subpixels; and
   wherein each of said nanofins within said plurality of nanofins is comprised of titanium dioxide.

14. The metasurface lens assembly as set forth in claim 13, wherein each of said photosensitive subpixels has a focal length as the distance from said first layer, and wherein each of said photosensitive subpixels associated with a given one of the colors of the color set has the same focal length, and wherein said photosensitive subpixels associated with different colors have different focal lengths.

15. The metasurface lens assembly as set forth in claim 13, wherein each of said nanofins within said plurality of nanofins extends for a height transversely to said first layer from said first layer to a distal end; and
   wherein each of said nanofins within said plurality of nanofins has a constant cross-section along said height.

16. The metasurface lens assembly as set forth in claim 13, wherein said first layer overlies said second layer and is disposed directly adjacent thereto.

17. A metasurface lens assembly comprising:
   a first layer with a plurality of nanofins each extending transversely therefrom and each being optically anisotropic and transmissive to light in the visible spectrum and in combination together having an optical characteristic set according to a phase profile;
   a second layer including a plurality of photosensitive subpixels each associated with a different color of a color set;
   said nanofins on said first layer configured to bend and focus each of a plurality of component colors within a beam of light and to direct said component colors onto corresponding ones of said photosensitive subpixels; and wherein each of said nanofins within said plurality of nanofins includes a precursor comprised of Tetrakis (dimethylamino)titanium (TDMAT).

* * * * *